(12) United States Patent
Humphrey et al.

(10) Patent No.: US 9,918,410 B2
(45) Date of Patent: Mar. 13, 2018

(54) FAN CONTROL SYSTEM AND METHOD

(75) Inventors: Daniel Humphrey, Houston, TX (US); Mohamed Amin Bemat, Cypress, TX (US); Reynaldo P. Domingo, Spring, TX (US); Reginald A. Whyte, Jr., Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 1137 days.

(21) Appl. No.: 12/725,051

(22) Filed: Mar. 16, 2010

(65) Prior Publication Data

US 2011/0228471 A1 Sep. 22, 2011

(51) Int. Cl.
*G05F 5/00* (2006.01)
*H05K 7/20* (2006.01)
*F04D 27/00* (2006.01)
*F04D 27/02* (2006.01)

(52) U.S. Cl.
CPC ....... *H05K 7/20836* (2013.01); *F04D 27/004* (2013.01); *F04D 27/0269* (2013.01); *G05F 5/00* (2013.01); *H05K 7/20718* (2013.01)

(58) Field of Classification Search
CPC .......................................... G05F 5/00
USPC .......................................... 307/72
See application file for complete search history.

(56) References Cited

U.S. PATENT DOCUMENTS

| | | | |
|---|---|---|---|
| 6,037,732 A * | 3/2000 | Alfano et al. | 318/471 |
| 6,368,064 B1 * | 4/2002 | Bendikas et al. | 417/2 |
| 6,545,438 B1 * | 4/2003 | Mays, II | 318/400.01 |
| 6,824,362 B2 * | 11/2004 | Dodson, III | 417/22 |
| 7,079,758 B2 * | 7/2006 | Sunaga et al. | 388/804 |
| 7,132,809 B1 | 11/2006 | Chang | |
| 7,199,542 B1 | 4/2007 | Chen | |
| 7,221,858 B2 * | 5/2007 | Ku | 318/400.08 |
| 7,375,486 B2 * | 5/2008 | Ku et al. | 318/599 |
| 7,447,423 B2 * | 11/2008 | Chiu et al. | 388/822 |
| 7,479,753 B1 * | 1/2009 | Mimberg | 318/599 |
| 7,538,453 B1 * | 5/2009 | Roux et al. | 307/86 |
| 7,586,287 B2 | 9/2009 | Chen et al. | |
| 7,615,946 B2 * | 11/2009 | Zhang et al. | 318/268 |
| 7,791,301 B2 * | 9/2010 | Huang et al. | 318/473 |
| 7,847,508 B2 * | 12/2010 | Liu | 318/599 |
| 8,037,325 B1 * | 10/2011 | Dalal | 713/300 |
| 8,193,744 B2 * | 6/2012 | Steiner et al. | 318/249 |
| 2003/0122430 A1 * | 7/2003 | Aldridge et al. | 307/64 |
| 2005/0007041 A1 | 1/2005 | Liu | |

(Continued)

OTHER PUBLICATIONS

Lassen, Jacob Lunn, "Sensorless control of BLDC fans by tiny microcontrollers", , Nov. 2005, pp. 20-22, http://www.embedded-control-europe.com/ceceknowhow/707/ecenov05p.20.pdf.

*Primary Examiner* — Adi Amrany
(74) *Attorney, Agent, or Firm* — International IP Law Group, PLLC

(57) ABSTRACT

One embodiment provides a system for controlling one or more pulse width modulated (PWM) fans. The system can include a control system configured to provide a voltage control signal corresponding to a DC output voltage for the one or more PWM fans. A variable DC voltage source is configured to supply the DC output voltage to the plurality of fans at one of at least two different DC voltages based on the voltage control signal. The DC output voltage from the variable DC voltage source is separate from a PWM control signal that is also supplied to the PWM fans.

11 Claims, 4 Drawing Sheets

(56) References Cited

U.S. PATENT DOCUMENTS

| | | |
|---|---|---|
| 2007/0069670 A1* | 3/2007 | Lin ............................... 318/254 |
| 2007/0292257 A1* | 12/2007 | Ooi et al. ........................... 415/1 |
| 2007/0297893 A1* | 12/2007 | Alon et al. ...................... 415/47 |
| 2008/0093458 A1 | 4/2008 | Pearce et al. |
| 2008/0288124 A1* | 11/2008 | Huang ......................... 700/300 |
| 2008/0306634 A1 | 12/2008 | Rozzi et al. |
| 2008/0306635 A1 | 12/2008 | Rozzi |
| 2008/0312888 A1 | 12/2008 | Vinson et al. |
| 2009/0009122 A1 | 1/2009 | Yoshitomi et al. |
| 2009/0155045 A1 | 6/2009 | Chang et al. |
| 2009/0169188 A1* | 7/2009 | Huang et al. ................. 388/811 |
| 2009/0204270 A1 | 8/2009 | Garcia |
| 2010/0281884 A1* | 11/2010 | Rawski et al. ................... 62/3.6 |

\* cited by examiner

FAN CONTROL SYSTEM AND METHOD

TECHNICAL FIELD

The invention relates to a fan control system and method.

BACKGROUND

Computer system components, such as central processing units (CPUs), chipset, graphics cards, and hard drives, produce large amounts of heat during operation. Overheated components generally exhibit a shorter life-span and may also cause malfunction of the computer system. One or more fans or other air movers can be utilized to help keep these components within safe operating temperatures.

DETAILED DESCRIPTION

Figure 1:
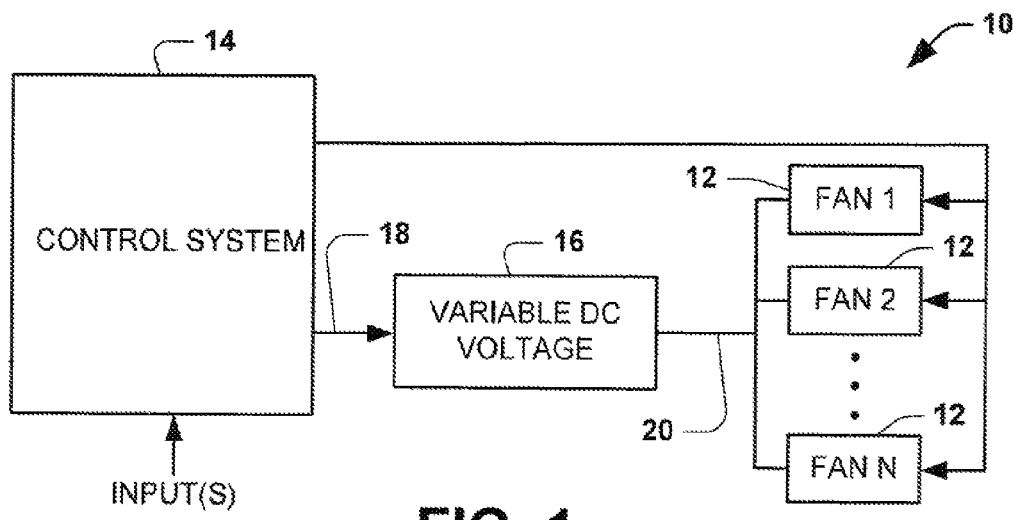
FIG. 1 depicts an example embodiment of a system that can be utilized to control one or more fans.

FIG. 1 depicts an example of a system 10 that can be utilized to control one or more fans 12, indicated at FAN 1, FAN 2, through FAN N, where N is a positive integer denoting the number of fans (N≥1). The one or more fans 12 are arranged to provide cooling of associated components. For instance, the system 10 can be implemented in a computer system (e.g., a server) in which the one or more fans 12 operate to help keep electronic components within safe operating temperatures. The system 10 is configured to control the one or more fans 12 in an efficient manner to achieve the cooling of the associated components.

The system 10 includes a control system 14 that is configured to control the one or more fan 12 based on one or more inputs. The input(s) can correspond to a sensed temperature, a virtual temperature as well as other parameters that can be utilized to determine airflow requirements for the system 10. The particular type of control and control signals generated by the control system 14 can vary depending on the type and configuration of the one or more fans 12.

As used herein, the term "airflow requirements" and variants thereof are intended to encompass an indication of whether an incremental amount (e.g., more or less) of airflow is desired or an amount of increase or decrease that may be desired. Additionally or alternatively, "airflow requirements" can refer to a calculated amount of airflow, such as may be represented as a unit of measurement of the flow of a gas (e.g., cubic feet per minute or liters per second) or as a function of fan speed (e.g., revolutions per minute (RPM)) to achieve such airflow.

At least one (or more) of the fans 12 is a pulse-width modulated (PWM) fan. For example, each of the N fans 12 can be a PWM fan. PWM fans are well known to those skilled in the art and are generally considered to be more energy efficient when compared to linear regulating (voltage control) fan motors. Each PWM fan 12 can be implemented as including a DC brushed and/or DC brushless motors, for example.

As used hereinafter, the term "PWM fan" or "fan" refers not only to fans attached to a computer chassis, but may also be intended to identify any other computer fans, such as CPU fans, graphics processing unit (GPU) fans, chipset fans, power supply unit (PSU) fans, hard disk drive (HDD) fans, or peripheral component interconnect (PCI) slot fans. PWM fans can be of various sizes and power. For instance, common computer fans have sizes range between 40 mm to 120 mm in diameter.

The control system 14 provides a PWM control signal to control the revolution speed of each PWM fan 12 according to a duty cycle represented by the PWM control signal. The control system 14 also provides a voltage control signal, indicated at 18, that is operative to control a voltage supplied to the one or more fan 12. A variable DC voltage source 16 is configured to provide a corresponding DC output voltage 20 to the one or more fans 12 based on the voltage control signal 18. The variable DC voltage source can provide the DC voltage at one of at least two different DC voltages based on the voltage control signal. For instance, the variable DC voltage source can be connected to each of the one or more fans 12 via a single bus or separate connections can be provided for providing a respective DC voltage to each of the fans where there is more than one fan. The DC voltage provided to each fan 12 can be the same or different depending on how the control and connections are implemented.

The control system 14 can be configured to coordinate the PWM control signal and the DC voltage control signal so that the one or more fan 12 is supplied a minimum available DC voltage and corresponding duty cycle to achieve desired airflow. Thus, by dynamically adjusting both the duty cycle of PWM control signal and the DC voltage supplied to each fan 12, the system 10 can operate the fans with a greater efficiency when compared to other approaches.

By way of example, a computer system (e.g., a server) implementing the system 10 can include a number of one or more sensors distributed about the computer system or other enclosure in which the system 10 resides. A microprocessor or other intelligent processing device can ascertain airflow requirements based on thermal data (e.g., the inputs in FIG. 1) gathered by the one or more sensors. The thermal data can include any information relating to the thermal status of the system as well as its constituent components. Examples of thermal data include, but are not limited to, "virtual" and actual temperatures, thermal status expressed in relative terms, such as cold, warm and hot, heat generation rates, heat dissipation rates, and cooling needs expressed in terms of fan speed. A "virtual" temperature can be a temperature calculated based on one or more actual temperature readings. For example, a management processor may provide a "virtual" temperature for a computer system or a given component based on the actual temperature reading from one or more temperature sensors in the system. The thermal data thus can be provided as input(s) based on which the control system determines fan control parameters.

Figure 2:
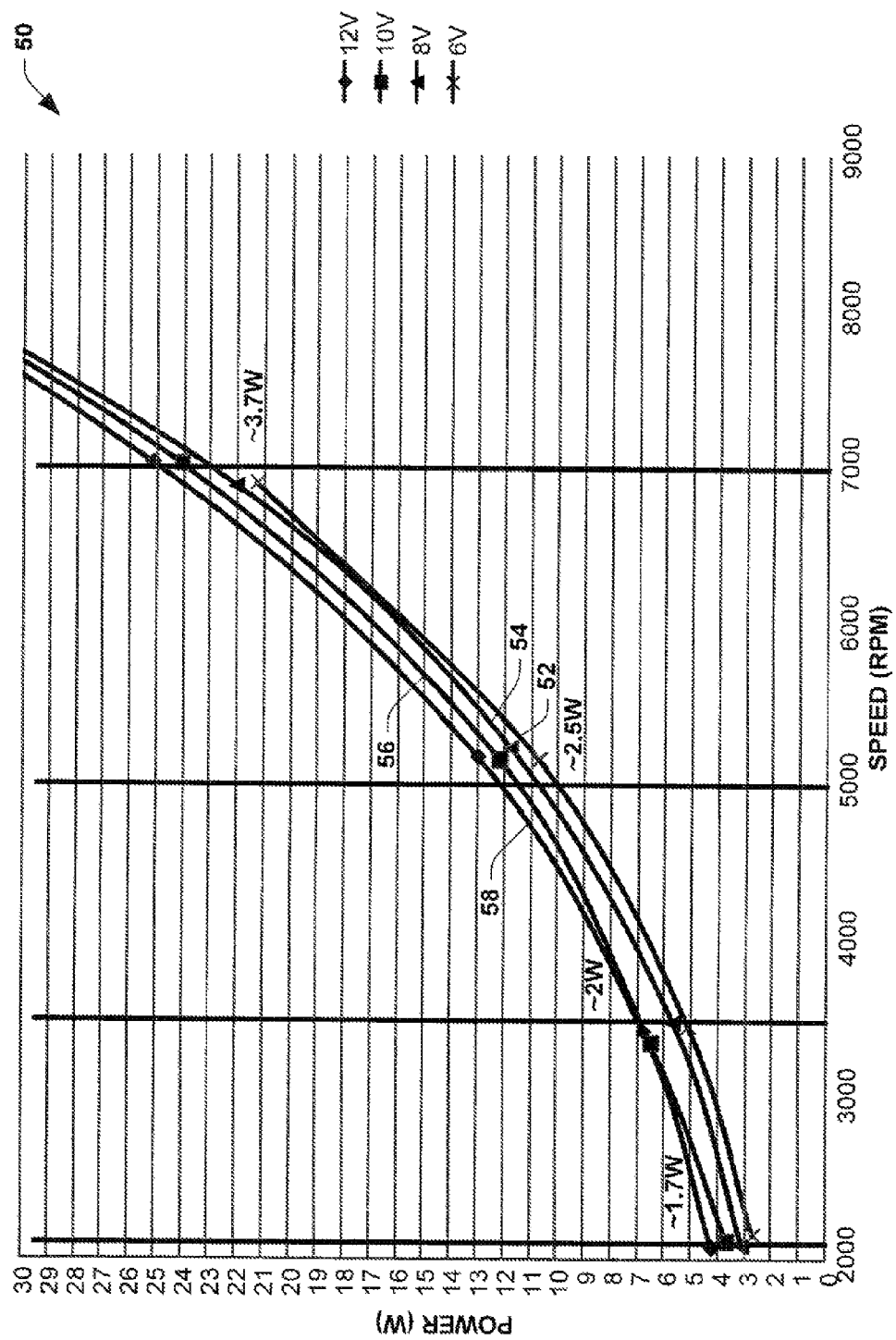
FIG. 2 is a graph depicting power as a function of speed that can be implemented in an embodiment of a fan control system.

FIG. 2 is a graph 50 demonstrating power versus fan speed for a plurality of DC supply voltages. A corresponding plot 52, 54, 56, 58 is depicted for each input voltage of 6 V, 8V, 10 V and 12 V, respectively. From the plots, it is shown that a variety of power savings thus can be realized by selecting the minimum available voltage (e.g., 6 V in this example) capable of providing a desired speed. However, as the speed requirements increase above that which can be achieved for a given minimum voltage, a new higher minimum voltage (e.g., 8 V or 10 V or 12 V) can be set accordingly. By dynamically adjusting the DC voltage that is supplied to the PWM fans, the power efficiency of the associated PWM circuitry can be kept high over a variety of fan speeds. For example, it has been determined in laboratory tests that power efficiency increases of up to 40% may be achieved by implementing a fan control system based on the teachings contained herein.

Figure 3:
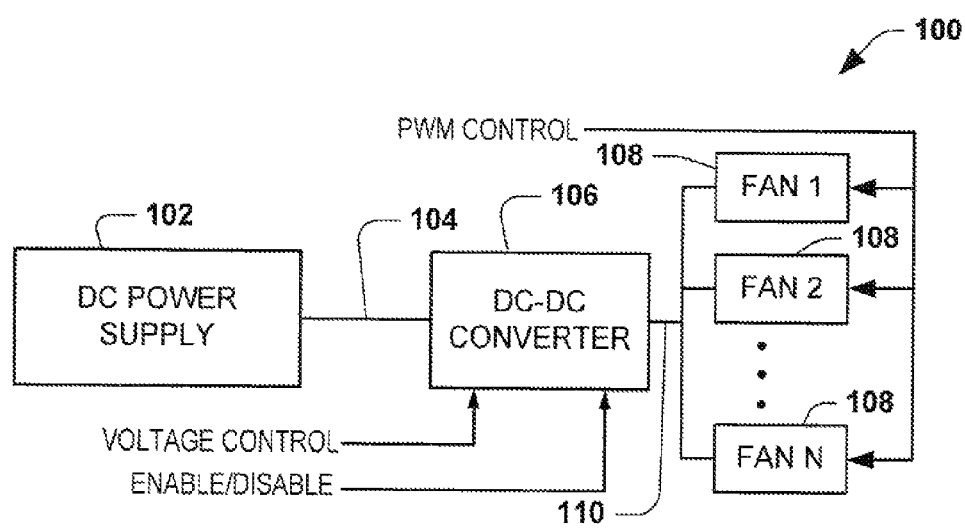
FIG. 3 depicts an example embodiment of another system that can be utilized to control one or more fans.

FIG. 3 depicts another example of fan control system 100 that can be implemented. The control system 100 includes a DC power supply 102 that provides a substantially fixed DC voltage, such as 12 V or other DC voltage. The fixed DC voltage can correspond to a power rail or bus 104 in a computer system (e.g., a server). Among other components in the computer system, a DC-DC converter 106 can be coupled to the rail 104 corresponding to the fixed DC voltage. The DC-DC converter 106 is configured to supply one or more fans 108 with a DC voltage, indicated at 110, which varies based on a voltage control signal. The DC-DC converter 106 can supply the same DC voltage to each of the one or more fans 108 via a common output connection. Alternatively, the DC-DC converter 106 can be connected to provide separate DC output voltages, which can be the same or different voltages, to two or more (up to all) of the fans 108 based on information in the voltage control signal. The DC-DC converter 106 thus converts the input DC voltage at 104 to one of at least two levels to provide the DC voltage 110 based on the voltage control signal.

The revolution speed of each PWM fan 108 can further be controlled according to a duty cycle of a PWM control signal. The PWM control signal can have a duty cycle that is controlled (e.g., via a control system or PWM controller) to achieve a desired fan speed for a given DC voltage 110, such as described herein. For instance, the PWM control signal and the DC voltage control signal can be coordinated so that the one or more fan 12 is supplied a minimum available DC voltage and PWM control signal having a corresponding duty cycle to achieve desired airflow requirements. Thus, by dynamically adjusting both the duty cycle of PWM control signal and the DC voltage supplied to the fan 108, the system 100 can operate the fans with a greater efficiency compared to other approaches.

Figure 4:
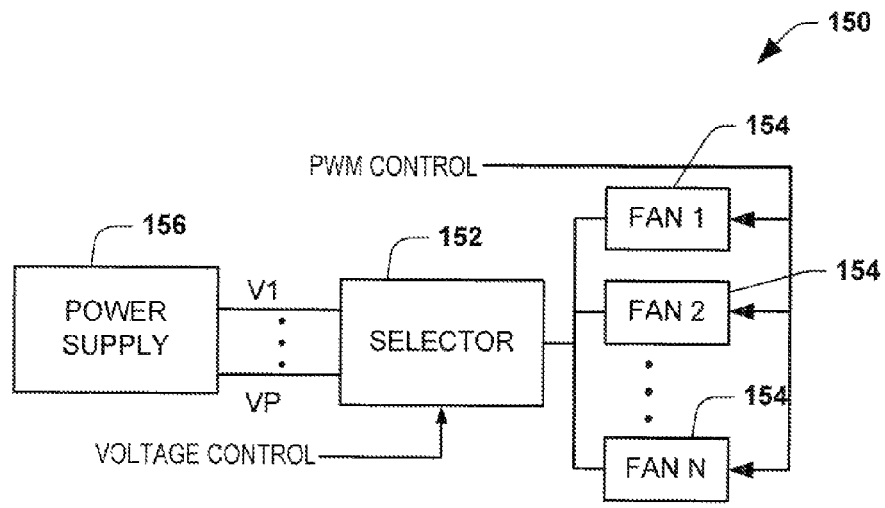
FIG. 4 depicts an example embodiment of another system that can be utilized to control one or more fans.

FIG. 4 depicts yet another example of fan control system 150 that can be implemented. In the example of FIG. 4, the variable DC voltage source is implemented as a voltage selector 152. The voltage selector 152 is configured to selectively provide one of a plurality (e.g., two or more) substantially fixed DC voltages, indicated at V1 to VP, where P denotes the number of DC voltages available for supplying the fans 154. The voltage selector 152 can supply the selected DC voltage as an input supply voltage to one or more fans 154. As described herein, one or more of the fans 154 can be PWM fans that operate with a revolution speed based on a duty cycle set according to a PWM control signal and the input supply voltage. The voltage selector 152 can be implemented, for example, as a switching circuit, a multiplexer or other means for connecting one of the plurality of DC voltages V1 to VP based on the voltage control signal to provide power to the fans 154.

The available fixed DC voltages can correspond to a set of voltage rails or power buses in a computer system (e.g., a server). That is, each of the fixed voltages V1 to VP can be supplied at a fixed level by a corresponding power rail. The voltage selector 152 can supply the same DC voltage to each of the one or more fans 108 via a common output connection. Alternatively, the voltage selector 152 can be connected to provide separate DC output voltages to two or more (up to all) of the fans 108 based on information in the voltage control signal.

As explained herein, the PWM control signal and the DC voltage control signal can be coordinated so that the one or more fan 154 is supplied with the minimum available DC voltage and PWM control signal having corresponding duty cycle to achieve desired airflow requirements (e.g., fan speed). Thus, by dynamically adjusting both the duty cycle of PWM control signal and the DC voltage supplied to the fans 154, the system 150 can operate the fans with a greater degree of power efficiency when compared to other approaches.

Figure 5:
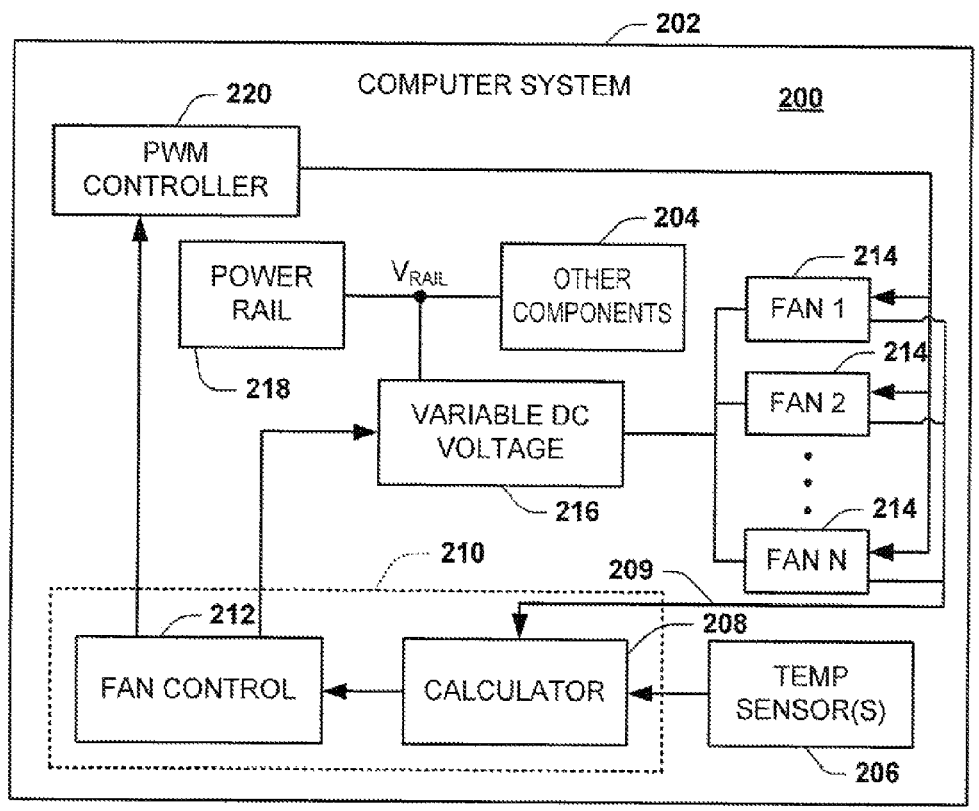
FIG. 5 depicts an example of a computer system implementing an embodiment of a fan control system.

FIG. 5 depicts an example of a computer system 200 implementing a fan control system configured for cooling the computer system. The computer system 200 includes an enclosure (or chassis) 202, in which the control system and other electronic components (e.g., microprocessors, power supplies, graphics processing unit, chipsets, memory, hard disk drives, CD or DVD drives, and the like) 204 reside. The other electronic components 204 generate heat during operation.

The computer system 200, as part of its fan control system, includes one or more temperature sensors 206 distributed throughout the enclosure 202. The sensors can be standalone sensors or sensors can be integrated into various electrical components. Each temperature sensor 206 monitors thermal properties within the enclosure and provide corresponding thermal data indicative of sensed temperature, such as described herein. The thermal data is provided to a calculator 208 for determining airflow requirements based on the thermal data. For instance, the calculator 208 computes fan speed based on the thermal data in which the airflow requirements correspond to fan speed. Additionally or alternatively, the calculator 208 can determine fan speed based on feedback, schematically indicated at 209, to achieve airflow requirements. The fan speed can be determined as an absolute fan speed (e.g., in RPM) and/or the fan speed can be determined as an incremental value, such as corresponding to an increase or decrease in the fan speed. The feedback 209 can indicate a current fan speed (e.g., from one or more tachometer (not shown)) for one or more fan from which controls can be implemented according to airflow requirements.

The calculator 208 can be implemented as executable instructions running on a processor (e.g., a central processing unit) 210 of the computer system 200. The computer system 200 can include any number of processors. Alternatively, the calculator 208 can be implemented as hardware or as a combination of hardware and software. The airflow requirements can, for example, correspond to an amount of airflow to achieve desired cooling electrical components within the enclosure 202.

A fan control 212 determines control parameters for controlling one or more fan 214. The control parameters can include both a DC supply voltage and duty cycle for controlling each fan 214. Similar to the calculator 208, the fan control 212 can be implemented as executable instructions running on the processor 210 of the computer system 200. The fan control 212 can compute parameters based on the determined airflow requirements and the known operating characteristics for each fan 214 (e.g., revolution speed for a given duty cycle and supply voltage). Alternatively, the calculator 208 can be implemented as a look-up table stored in memory and indexed according to airflow requirements (e.g., fan speed). For instance, a look-up table implementation for the calculator 208 can be programmed to provide a voltage control signal and duty cycle based on the determined airflow requirements. The look-up table thus can be utilized to power each fan 214 with a minimum available DC voltage and PWM duty cycle and, thereby achieve desired airflow (corresponding to fan speed). Those skilled in the art will appreciate various ways that the calculator 208 and the fan control 212 can be implemented to determine power efficient control parameters for controlling each fan 214.

The voltage control signal is provided to a variable DC voltage source 216. The variable DC voltage source 216 provides a variable DC voltage to each fan 214 based on the voltage control signal. The variable DC voltage source 216 can be implemented as a switching system configured to selectively provide one of two or more DC voltages as an input supply voltage for each fan 214 (see, e.g., FIG. 4). For instance, a computer system can include one or more power rails ($V_{RAIL}$) 218 that provides respective DC supply voltages (e.g., at 12 V and 6 V) for the system 200. The variable DC voltage source 216 can selectively provide an appropriate DC supply voltage to each fan 214 based on the voltage control signal to achieve airflow requirements. Alternatively, the variable DC voltage source 216 can be implemented as a DC-DC converter configured to convert a DC supply voltage to a desired minimum DC voltage for operating each fan 214 based on the voltage control signal (see, e.g., FIG. 3). The DC voltage can be provided to each fan 214 at discrete levels ranging from a minimum DC voltage for operating the fans up to a maximum DC voltage according to internal power supply rails in the computer system 200.

A PWM controller 220 also provides a PWM control signal to each fan 214 with a duty cycle determined by the fan control 212. The PWM controller 220 can be a separate circuit (e.g., an IC), as shown, or it can be integrated into circuitry of each fan 214. The duty cycle can be set according to the minimum available DC voltage supplied to each fan and still achieve desired airflow requirements (e.g., fan revolution speed). Thus, by dynamically adjusting both the duty cycle of PWM control signal and the DC voltage supplied to each fans 214, the fans 214 can operate a greater degree of power efficiency when compared to many other approaches.

Figure 6:
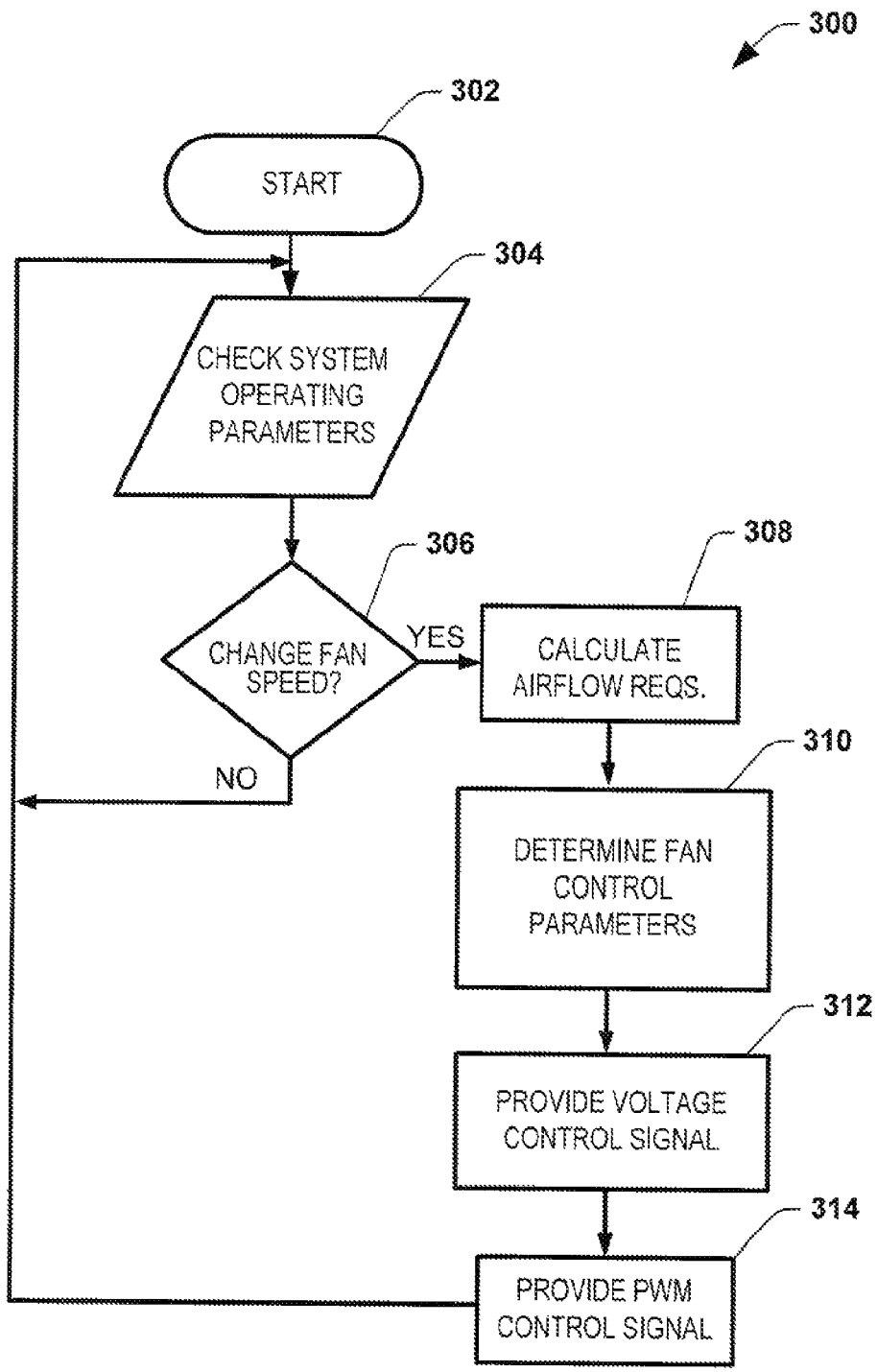
FIG. 6 depicts a flow diagram of an example embodiment of a method that can be implemented to control one or more fans.

In view of the foregoing structural and functional features described above, certain methods will be better appreciated with reference to FIG. 6. It is to be understood and appreciated that the illustrated actions, in other embodiments, may occur in different orders and/or concurrently with other actions. Moreover, not all illustrated features may be required to implement a method. It is to be further understood that the following methodology can be implemented in hardware (e.g., a computer, a computer network or a specially designed test system), software (e.g., as executable instructions running on one or more computer systems or a specially design test fixture), or any combination of hardware and software.

FIG. 6 depicts an example of a method 300 that can be implemented to control one or more PWM fans, such as arranged and configured to provide cooling for a computer system. For instance, the method 300 can be implemented as part of a control loop for controlling airflow within an enclosure of the computer system. The method 300 begins at 302, such as in connection with powering up the computer system its associated electrical components. At 304, system operating parameters are checked, such as via one or more sensors. For example, sensors can be provided to monitor one or more operating parameter, such as including but not limited to temperature and fan speed.

At 306, a determination is made as whether a change in speed for one or more (e.g., all) fans is needed. The determination can be based on the one or more operating parameters checked at 304. If the sensed operating parameters do not indicate a need to change the speed of the fans (NO), the method returns to 304 to continue monitoring operating parameters (e.g., temperature characteristics, fan speed). If a change in fan speed is required at 306 (YES), the method proceeds to 308. At 308, airflow requirements (e.g., fan speed) are determined, such as based on thermal data derived from the sensed temperature (at 304). At 310, fan control parameters are determined. The fan control parameters can include a minimum available DC supply voltage and duty cycle for controlling each fan 214 to meet the determined airflow requirements, such as described herein. At 312, a voltage control signal is provided to set the DC supply voltage for each fan. At 314, a PWM control signal is provided to set the speed of each fan for the determined DC supply voltage. From 314, the method returns to 304 in which the operating parameters are monitored to provide feedback to help ensure that the desired fan speed is achieved and maintained according to the sensed parameters.

In view of the foregoing, it will be appreciated that a control system and method for controlling fans can be implemented to achieve a greater level of efficiency. That is, the systems and methods can dynamically adjust an input supply voltage for each PWM fan so that the PWM circuitry operates more efficiently. Laboratory testing has demonstrated that the systems and methods disclosed herein can be utilized achieve up to a 40% increase in power efficiency from existing fan power control topologies.

What has been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of the appended claims.

What is claimed is:

1. A process comprising:
  a) determining a desired second fan speed for a pulse-width modulated (PWM) fan being operated at first fan speed using a first minimum available voltage and a first duty cycle of a PWM control signal;
  b) determining, based on the desired second fan speed, a second minimum available voltage from a set of plural discrete available voltages, the second minimum available voltage being different from said first minimum available voltage, the second minimum available voltage being the minimum of the available voltages capable of providing the desired second fan speed for the PWM fan;
  c) determining, based on the desired second fan speed and the determined second minimum available voltage, a second duty cycle that, when used to drive the PWM fan using the determined second minimum available voltage, will achieve the desired second fan speed for the PWM fan; and
  d) changing from operating the PWM fan at the first fan speed to operating the PWM fan at the second fan speed by simultaneously adjusting a voltage control signal and the PWM control signal to change from the first minimum available voltage to the second minimum available voltage and from the first duty cycle to the second duty cycle.

2. A process as recited in claim 1 wherein actions a-d are iterated so that the PWM fan is operated at different speeds using different voltages and different pulse widths.

3. A process as recited in claim 1 further comprising gathering thermal data using temperature sensors, the determining a desired second fan speed being based on the gathered thermal data.

4. A process as recited in claim 3 wherein the determining a desired second fan speed includes determining a virtual temperature based at least in part on the gathered thermal data.

5. A process as recited in claim 1 wherein the determining a desired second fan speed is based at least in part on feedback indicating a current actual fan speed.

6. A process as recited in claim 1 wherein the desired second fan speed is either an absolute fan speed or an incremental fan speed.

7. A computer program product comprising non-transitory media encoded with code that when executed by a processor, causes the processor to implement the process of claim 1.

8. A system comprising:
   a pulse-width modulation (PWM) controller to provide a PWM control signal to control the speed of a PWM fan;
   a voltage selector configured to select, from a voltage set of discrete voltages available from a power source, a voltage to be provided to the PWM fan; and
   a processing unit programmed to,
   determine a desired second fan speed for the PWM fan being operated at a first fan speed using a first minimum available voltage and a first duty cycle of the PWM control signal,
   determine, based on the desired second fan speed, a second minimum available voltage such that the second minimum available voltage is the minimum of the available voltages in the voltage set at which the desired second fan speed can be achieved, and
   determine, based on the desired second fan speed and the second minimum available voltage, a second duty cycle that achieves the desired second fan speed given the determined second minimum available voltage,
   the processing unit being coupled to the voltage selector and to the PWM controller to change from operating the PWM fan at the first fan speed to operating the PWM fan at the desired second fan speed by simultaneously adjusting a voltage control signal and the PWM control signal to change from the first minimum available voltage to the second minimum available voltage and from the first duty cycle to the second duty cycle.

9. A system as recited in claim 8 wherein the desired second fan speed is an absolute fan speed or an incremental fan speed.

10. A system as recited in claim 8 further comprising a temperature sensor, the determining a desired second fan speed being based at least in part on temperature data gathered by the temperature sensor.

11. A system as recited in claim 8 further comprising a tachometer coupled to the PWM fan to determine a current fan speed, the determining a desired second fan speed being based at least in part on the current fan-speed data provided by the tachometer.

* * * * *